United States Patent
Abe

(10) Patent No.: US 6,411,663 B1
(45) Date of Patent: Jun. 25, 2002

(54) CONVOLUTIONAL CODER AND VITERBI DECODER

(75) Inventor: Masami Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/291,068

(22) Filed: Apr. 14, 1999

(30) Foreign Application Priority Data

Apr. 22, 1998 (JP) .......................................... 10-128243

(51) Int. Cl.[7] .......................... H03D 1/00; H04L 27/06; H04L 5/12; H04L 23/02; H03M 13/03
(52) U.S. Cl. ........................ 375/341; 375/262; 714/786; 714/795
(58) Field of Search ................................. 375/262, 265, 375/340, 341; 714/786, 792, 794, 795

(56) References Cited

U.S. PATENT DOCUMENTS 5,402,447 A * 3/1995 Roney, IV ................... 375/340
5,434,886 A * 7/1995 Kazawa et al. ............. 375/262
5,453,997 A * 9/1995 Roney, IV ................... 375/341

* cited by examiner

*Primary Examiner*—Betsy L. Deppe
(74) *Attorney, Agent, or Firm*—Venable; Robert J. Frank

(57) ABSTRACT

A convolutional coder performs rate 1/N and 1/M convolutional coding (M<N). The convolutional coder includes a convolutional code generator, a parallel/serial converter, a rate indicator, and a selector. The rate indicator indicates either rate 1/N or 1/M convolutional coding. The selector provides the N convolutional coding bits for rate 1/N convolutional coding. Also for the rate 1/M convolutional coding, the selector provides M convolutional coding bits generated by M generator polynominals common to rate 1/N and 1/M convolutional coding and nullifies (N–M) convolutional coding bits generated by the other (N–M) generator polynominals for the rate 1/N convolutional coding. A Viterbi decoder performs rate 1/N convolutional decoding and includes a rate indicator and a data converter. The rate indicator detects a 1/N or 1/M convolutional coding rate from a received signal (M<N). The data converter provides to a Viterbi decoding circuit N convolutional coding bits generated by N generator polynominals for the rate 1/N convolutional coding. Also, for the rate 1/M convolutional coding, the data converter provides to the Viterbi decoding circuit M convolutional coding bits generated by M generator polynominals common to the 1/N convolutional coding and the rate 1/M convolutional coding and replaces the other (N–M) convolutional coding bits with nullified data.

11 Claims, 5 Drawing Sheets

CONVOLUTIONAL CODER AND VITERBI DECODER

BACKGROUND OF THE INVENTION

1. Field of the Invention

This invention relates generally to digital signal processing, and more specifically relates to a convolutional coder and Viterbi decoder used in a radio communication apparatus.

2. Description of the Background Art

In general, error correcting systems such as convolutional coding, Bose-Chaudhuri-Hocquenghem coding (BCH) or Reed Solomon (RS) coding are well known in the field of radio communications. In radio communication systems, digital signals to be transmitted must be error coded so that the receiver can decode them accurately. Error coding is required because bit errors occur due to noise interference and similar phenomenon whenever signals are transmitted over radio channels.

Convolutional coding is one of the error correcting systems that relates a current signal with past signals by using at least one generator polynominal. If two generator polynominals are used, the system is referred to as rate ½ convolutional coding, and the coded output data is double the input data. Furthermore, if three generator polynominals are used, the system is referred to as rate ⅓ convolutional coding, and the coded output data is triple the input data. Therefore, the more numerous the coded output data is, the more accurate the error correcting ability at a decoder of a receiver is. In radio communication systems, it is necessary to select a convolutional coding rate in consideration of both the transmission quality and transmission efficiency.

FIGS. 4(a) and 4(b) show a conventional convolutional coder and a conventional Viterbi decoder. In FIG. 4(a), the conventional convolutional coder includes a selector 23, a rate ½ convolutional coder 24, a rate ⅓ convolutional coder 25 and a selector 26. The conventional convolutional coder selects either the rate ½ convolutional coder 24 or the rate ⅓ convolutional coder 25 in response to convolutional coding rates (R=½ or R=⅓). In FIG. 4(b), the Viterbi decoder includes a selector 33, a rate ½ Viterbi decoder 34, a rate ⅓ Viterbi decoder 35 and a selector 36. The Viterbi decoder selects either the rate ½ Viterbi decoder 34 or the rate ⅓ Viterbi decoder 35 in response to convolutional coding rates. Therefore, a conventional radio transceiver having the two convolutional coders and the two Viterbi decoders becomes large-sized and complicated.

SUMMARY OF THE INVENTION

Therefore, it is an object of the present invention to provide an improved convolutional coder performing a plurality of convolutional coding rates. Another object of the present invention is to provide an improved Viterbi decoder performing a Viterbi decoding of the convolutional coded signal with different convolutional coding rates.

To accomplish these objectives, a convolutional coder for performing a rate 1/N convolutional coding and a rate 1/M convolutional coding, where M and N are positive integers and M<N. The convolutional coder includes a convolutional code generator, a parallel/serial converter, a rate indicator and a selector. The convolutional code generator generates respectively N convolutional coding bits based on N generator polynominals. The parallel/serial converter converts the convolutional coding bits to a serial convolutional coding sequence. The rate indicator indicates a convolutional coding rate of either the rate 1/N convolutional coding or rate 1/M convolutional coding. The selector provides the N convolutional coding bits when performing rate 1/N convolutional coding. Also, the selector provides M convolutional coding bits generated by the M generator polynominals common to the rate 1/N convolutional coding and the rate 1/M convolutional coding and nullifies the (N−M) convolutional coding bits generated by other (N−M) generator polynominals for rate 1/N convolutional coding when performing the rate 1/M convolutional coding.

Furthermore, to accomplish these objectives, a Viterbi decoder for performing a rate 1/N convolutional decoding, where N is a positive integer, includes a rate indicator and a data converter. The rate indicator detects a 1/N or 1/M convolutional coding rate from a received signal having rate information provided by a convolutional coder and provides an instruction based on the detected convolutional coding rate, where M is a positive integer and M<N. The data converter provides to a Viterbi decoding circuit N convolutional coding bits generated by N generator polynominals for the rate 1/N convolutional coding when the instruction from the rate indicator corresponds to the detected 1/N convolutional coding rate. Also the data converter provides to the Viterbi decoding circuit M convolutional coding bits generated by M generator polynominals common to the rate 1/N convolutional coding and the rate 1/M convolutional coding and replaces the other (N−M) convolutional coding bits with nullified data when the instruction from the rate indicator corresponds to the detected 1/M convolutional coding rate.

BRIEF DESCRIPTION OF THE DRAWINGS

These and other objects and features of the present invention will become more apparent from consideration of the following detailed description taken in conjunction with the accompanying drawings in which.

DESCRIPTION OF THE PREFERRED EMBODIMENT

Figure 1A:
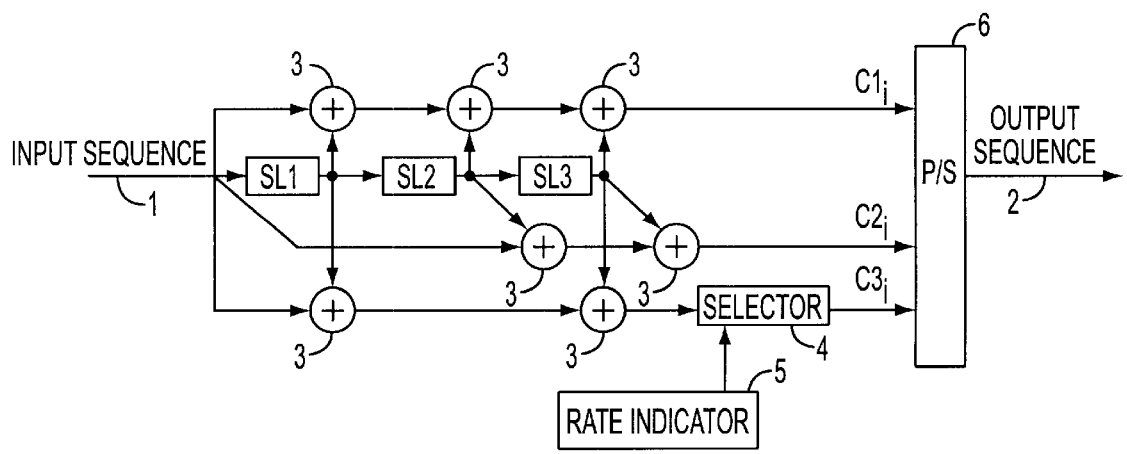
FIG. 1(a) is a block diagram showing the construction of a convolutional coder according to a first embodiment of the invention.
Figure 1B:
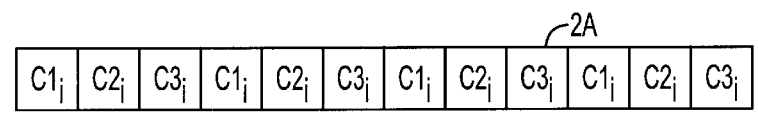
FIG. 1(b) is a data structure showing an output of the convolutional coder that performs a rate ⅓ convolutional coding.
Figure 1C:
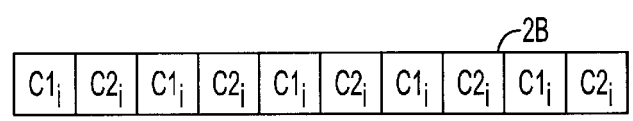
FIG. 1(c) is a data structure showing an output of the convolutional coder that performs a rate ½ convolutional coding.

FIG. 1(a) shows a convolutional coder, FIG. 1(b) shows output data of the convolutional coder when performing a rate ⅓ convolutional coding and FIG. 1(c) shows output data of the convolutional coder when performing a rate ½ convolutional coding.

The convolutional coder shown in FIG. 1(a) includes seven exclusive OR circuits 3, three shift registers SL1, SL2, and SL3, a selector 4, a rate indicator 5, and a parallel/serial converter 6. The convolutional coder then convolutional codes an input bit sequence 1 into an output bit sequence 2 consisting of a first bit sequence $C1_i$, a second bit sequence $C2_i$ and a third bit sequence $C3_i$. The first bit sequence $C1_i$ is obtained by calculating the following first generator polynominal:

$$C1_i=C_n(+)C_{n-1}(+)C_{n-2}(+)C_{n-3}$$

where $C_n$ is an input bit, $C_{n-1}$ is the first previous bit output by the shift register SL1, $C_{n-2}$ is the second previous bit output by the shift register SL2, $C_{n-3}$ is the third previous bit output by the shift register SL3, and (+) indicates the exclusive OR operation.

Similarly, the second bit sequence $C2_i$ is obtained by calculating the following second generator polynominal:

$$C2_i=C_n(+)C_{n-2}(+)C_{n-3}$$

The third bit sequence $C3_i$ is obtained by calculating the following third generator polynominal:

$$C3_i=C_n(+)C_{n-1}(+)C_{n-3}$$

The parallel/serial converter 6 converts parallel data sequences, which is comprised of the first bit sequence $C1_i$, the second bit sequence $C2_i$ and the third bit sequence $C3_i$, to a serial output bit sequence 2. In this way, it is possible to send convolutional codes serially. Here, the third bit sequence $C3_i$ is output to the parallel/serial converter 6 via the selector 4 that is controlled by a command signal output by the rate indicator 5. The selector 4 outputs the third bit sequence $C3_i$ to the parallel/serial converter 6 when the command signal indicates a rate ⅓ convolutional coding. On the other hand, the selector 4 nullifies the third bit sequence $C3_i$ when the command signal indicates a rate ½ convolutional coding. For example, the selector 4 does not output the third bit sequence $C3_i$ to the parallel/serial converter 6 if the command signal indicates the rate ½ convolutional coding. In this way, the parallel/serial converter 6 outputs the output bit sequence 2A shown in FIG. 1(b) when the selector 5 passes the third bit sequence $C3_i$. The parallel/serial converter 6 also outputs the output bit sequence 2B shown in FIG. 1(c) when the selector 5 nullifies the third bit sequence $C3_i$.

Figure 5:
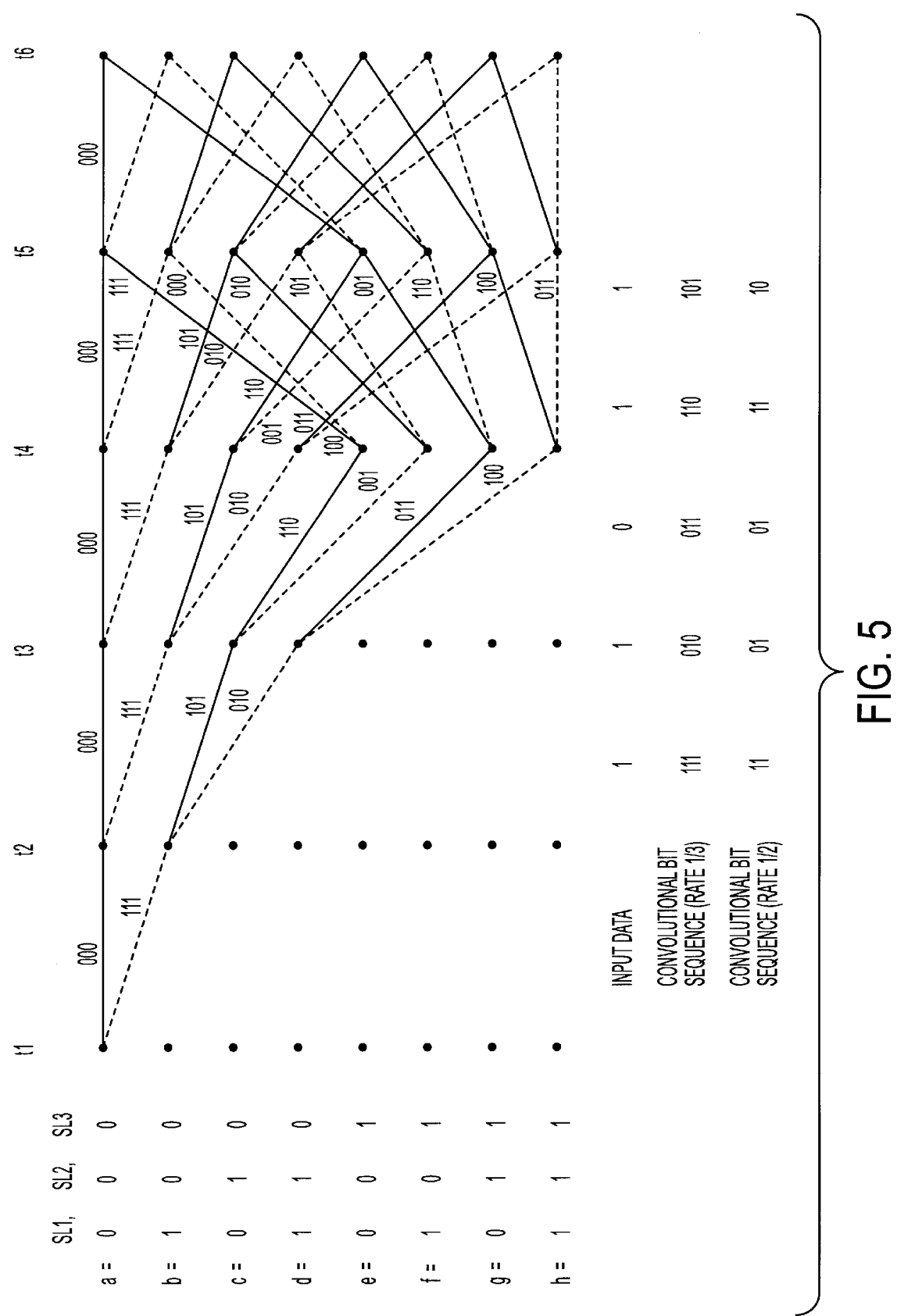
FIG. 5 is a trellis diagram for the rate ⅓ convolutional coder of FIG. 1(a)

FIG. 5 shows a trellis diagram for the rate ⅓ convolutional coder of FIG. 1(a). Each node in the tree structure of FIG. 5 is labeled corresponding to the 8 possible states in the shift registers SL1, SL2 and SL3, as follows: a=000, b=100, c=010, d=110, e=001, f=101, g=011, h=111. The first branching of the tree structure, at time t1, produces a pair of nodes double. The second branching, at time t2, results in four nodes labeled a, b, c and d. The third branching, at time t3, results in eight nodes labeled a, b, c, d, e, f, g and h. After the fourth branching, at time t4, there are a total of sixteen nodes.

All branches emanating from each node of the same state generate an identical convolutional bit sequence as shown on the branche in FIG. 5. For example, each node [a] at times t1–t5 has an emanating branch with the convolutional bit sequence 000 and an emanating branch with the convolutional bit sequence 111. As another example, each node [b] at times t2–t5 has an emanating branch with the convolutional bit sequence 101 and an emanating branch with the convolutional bit sequence 010. The reason for this is obvious from the above mentioned three generator polynominals.

In FIG. 5, a solid branch from a node at time t(k) to another node at time t(k+1) indicates that an input data '0' is input to the convolutional coder. A dashed branch from a node at time t(k) to another node at time t(k+1) indicates that an input data '1' is input to the convolutional coder.

The following example illustrates traversing the trellis diagram in FIG. 5 when performing the rate ⅓ convolutional coding. If input data '1' is input to the convolutional coder at time t1 at state [a], the coder outputs a convolutional code '111' corresponding to the first, second and third bit sequences $C1_i$, $C2_i$ and $C3_i$ based on the generator polynominals. Next, if input data '1' is input at time t2 at state [b], the coder outputs a convolutional code '010'. Similarly, if input data '0', '1', '1' are successively input, the coder outputs convolutional codes '011', '110', '101' in turn.

The following example illustrates traversing the trellis diagram in FIG. 5 when performing the ½ convolutional coding. If input data '1' is input to the convolutional coder at time t1 at state [a], the coder outputs a convolutional code '11' corresponding to first and second bit sequences $C1_i$ and $C2_i$ because third bit sequence $C3_i$ is nullified by the selector 4. Next, if input data '1' is input at time t2 at state [b], the coder outputs a convolutional code '10'. Similarly, if input data '0', '1', '1' are successively, the coder outputs convolutional codes '01', '11', '10' in turn.

In this embodiment, the selector 4 can be easily replaced to another device, if the device is capable of passing and nullifying the third bit sequence $C3_i$ based on the command signal output by the rate indicator 5.

Figure 2:
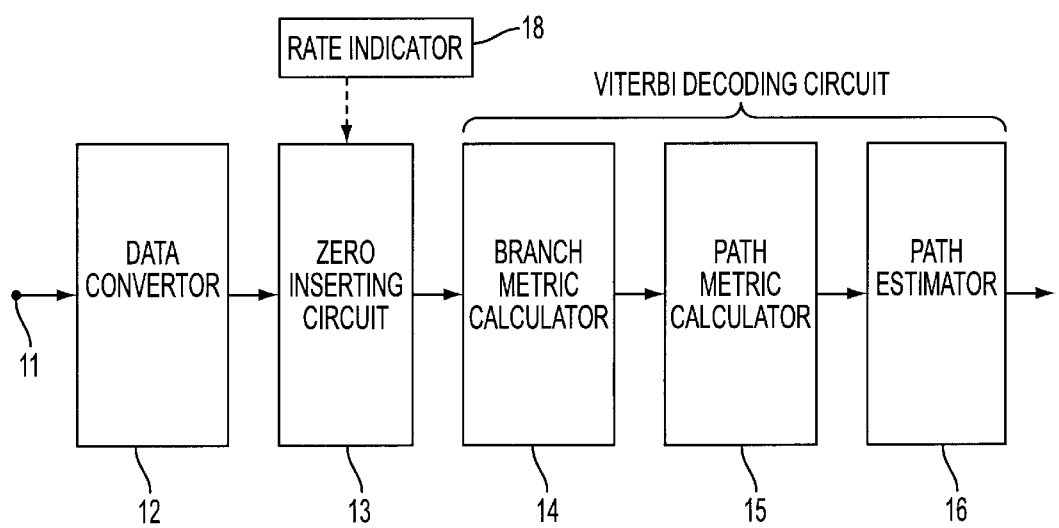
FIG. 2 is a block diagram showing the construction of a Viterbi decoder according to the invention.

Referring now to the Viterbi decoder of this embodiment, FIG. 2 shows a Viterbi decoder, which has a data converter 12, a zero inserting circuit 13, a branch metric calculator 14, a path metric calculator 15, a path estimator 16 and rate indicator 18. The Viterbi decoder generally decodes a received bit sequence and outputs a decoded bit sequence. As shown in FIG. 2, a received bit sequence is provided to the data converter 12 via the input terminal 11.

The data converter 12 converts the received bit sequence (first, second and third bit sequences $C1_i$, $C2_i$ and $C3_i$) such that a received bit '0' is converted to '−1' and a received bit '1' is converted to '1'.

The zero inserting circuit 13 passes the converted data sequence output by the data converter 12 to the branch metric calculator 14 when the rate indicator indicates 18 the rate ⅓ convolutional coding. Also, the zero inserting circuit 13 inserts a '0' into each portion of the third bit sequence $C3_i$ shown in FIG. 1(b) when the rate indicator indicates the rate ½ convolutional coding.

The branch metric calculator 14 calculates each branch metric BM by using the following equation:

$$BM=C1_i*BM(N,1)+C2_i*BM(N,2)+C3_i*BM(N,3)$$

Figure 6:
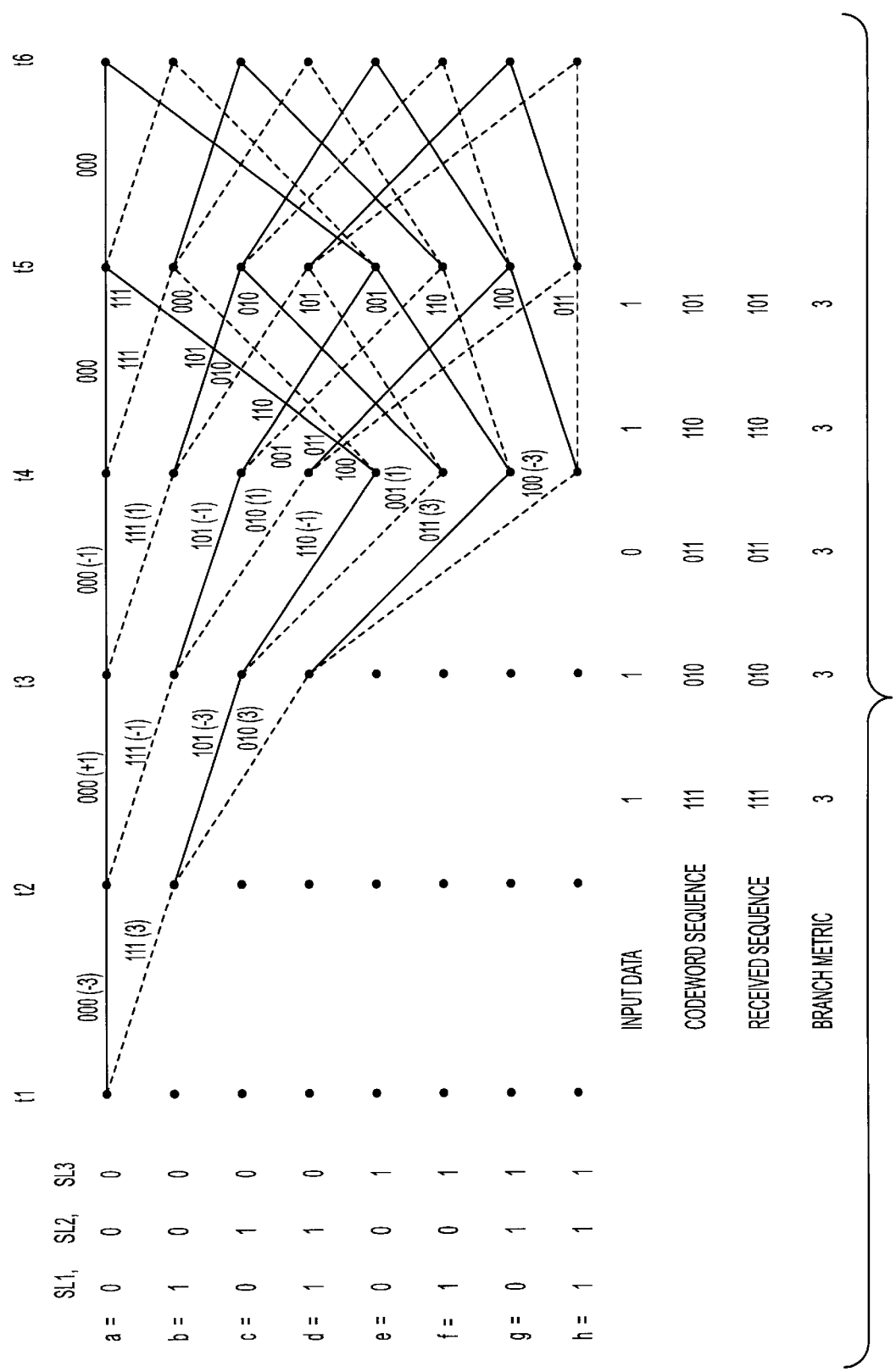
FIG. 6 is a trellis diagram for the rate ⅓ Viterbi decoder of FIG. 2.

The branch metric calculator 14 calculates a correlation between the received sequence ($C1_i$, $C2_i$, $C3_i$) and the codeword (BM(N,1), BM(N,2), BM(N,3)) as shown on each branch in FIG. 6. For each codeword BM(N,1), BM(N,2), and BM(N,3) is the code symbol that would be expected to be output from the coder as a result of each state transition.

For the case when the zero inserting circuit 13 inserts a '0' into each portion of $C3_i$ (i.e., for the rate ½ convolutional coding), the branch metric calculator 14 calculates a correlation between the received sequence ($C1_i$, $C2_i$, $C3_i$) and the codeword (BM(N,1), BM(N,2), BM(N,3)) using the same equation as for the rate ⅓ convolutional coding. Thus, when calculating the branch metric for the rate ½ convolutional coding, the calculating performed by the branch metric calculator 14 is equivalent to calculating the following equation because the zero inserting circuit 13 inserts a '0' into each portion of $C3_i$:

$$BM=C1_i*BM(N,1)+C2_i*BM(N,2)$$

The branch metrics calculated by the branch metric calculator 14 are provided to the path metric calculator 15. The path metric calculator 15 calculates each path metric by summing the branch metrics of the connected branches. The path estimator 16 selects an optimum path as the path the largest path metric.

FIG. 6 shows a trellis diagram for the rate ⅓ Viterbi decoder in this embodiment. Each node of in the tree of FIG. 6 is labeled corresponding to the 8 possible states in the shift registers SL1, SL2 and SL3, as follows: a=000, b=100, c=010, d=110, e=001, f=101, g=011, h=111.

As an example, at the bottom of FIG. 6, each codeword sequence and branch metric is shown for the branches based the received bit sequence of '111', '010', '011', '110', '101' as shown in FIG. 6. Based on this received bit sequence, the branch metric calculator 14 calculates each branch metric by using the above equation. If the received sequence is '111', the branch metric (state [a] to state [a]) is calculated as '−3' and the branch metric (state [a] to state [b]) is calculated as '3'. Similarly, each branch metric is shown on the branches in FIG. 6.

The path metric calculator 15 adds the branch metrics for every path to determine the path metrics. The path estimator 16 determines an optimum path based on the path having the largest path metric.

Figure 3:
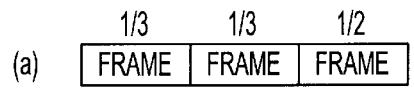
FIGS. 3(a), 3(b) and 3(c) are timing charts showing the timing of changing of convolutional rates.
Figure 3:
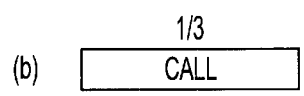
Figure 3:
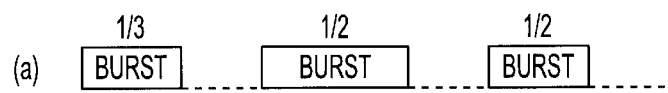
Figure 4A:
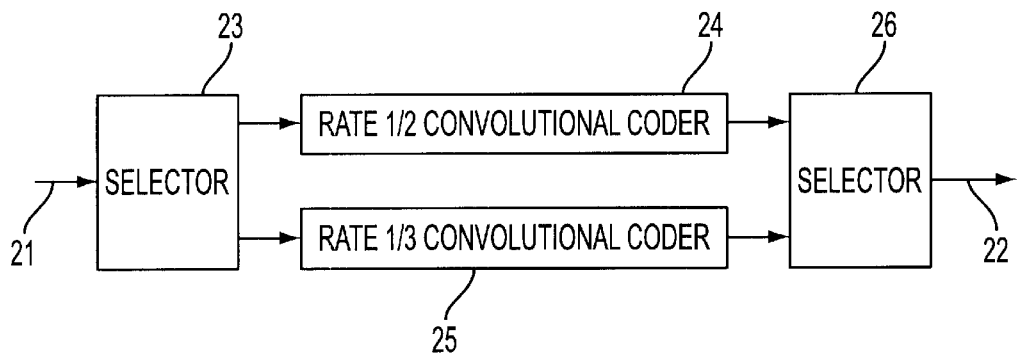
FIGS. 4(a) and 4(b) are block diagrams showing the construction of a conventional convolutional coder and a Viterbi decoder.
Figure 4B:
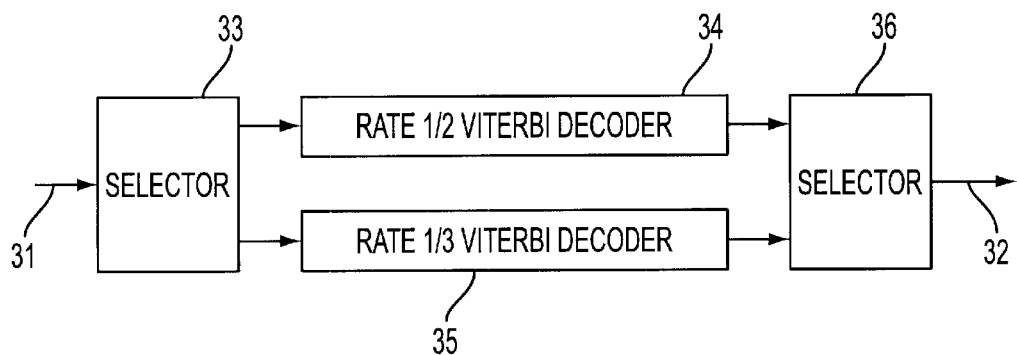

FIGS. 3(a), 3(b) and 3(c) show the timing of a rate change between the rate ⅓ and ½ convolutional codes. As shown in FIG. 3(a), it is possible to change the convolutional coding rate every frame. In this case, an information bit indicating the convolutional coding rate is provided at the head portion of each frame.

Also, it is possible to change the rate for each call as shown in FIG. 3(b). That is, when starting the call, the convolutional coding rate is determined.

Furthermore, it is possible to change the rate in each burst frame as shown in FIG. 3(c).

Additionally, if information indicating the convolutional coding rate and its timing is transmitted to the decoder, the convolutional coding rate can be changed at any time.

Although the invention has been illustrated using rate ⅓ convolutional coding and rate ½ convolutional coding, the invention can be practiced using rate 1/N convolutional coding and rate 1/M convolutional coding, where N and M are positive integers and M<N.

Although the invention has been illustrated using one bit shifting in the coder and decoder, the invention can be practiced using more than one bit shifting.

As those skilled in the art will recognize, the invention can be implemented with hardware, software, or a combination of hardware and software.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A convolutional coder for performing a rate 1/N convolutional coding and a rate 1/M convolutional coding, wherein N and M are positive integers and M<N, comprising:
    a convolutional code generator for generating N convolutional coding bits based on N generator polynominals,
    a parallel/serial converter for converting the convolutional coding bits to a serial convolutional coding sequence,
    a rate indicator for indicating a convolutional coding rate of either the rate 1/N convolutional coding or the rate 1/M convolutional coding, and
    a selector for providing the N convolutional coding bits when performing the rate 1/N convolutional coding, and for providing M convolutional coding bits generated by M generator polynominals common to the rate 1/N convolutional coding and the rate 1/M convolutional coding and for nullifying (N−M) convolutional coding bits generated by other (N−M) generator polynominals for the rate 1/N convolutional coding when performing the rate 1/M convolutional coding.

2. The convolutional coder according to claim 1, wherein said parallel/serial converter fails to output the nullified (N−M) convolutional coding bits when performing the 1/M convolutional coding.

3. The convolutional coder according to claim 1, wherein said rate indicator indicates a convolutional coding rate for every frame having the convolutional coding bits.

4. The convolutional coder according to claim 1, wherein said rate indicator indicates a convolutional coding rate for every burst frame having the convolutional coding bits.

5. A convolutional coder according to claim 1, wherein said rate indicator indicates a convolutional coding rate for every call.

6. A Viterbi decoder for performing a rate 1/N convolutional decoding, wherein N is a positive integer, comprising:
    a rate indicator for detecting a 1/N or 1/M convolutional coding rate from a received signal having rate information input by a convolutional coder and for providing an instruction based on the detected convolutional coding rate, wherein M is a positive integer and M<N,
    a data converter for providing to a Viterbi decoding circuit N convolutional coding bits generated by N generator polynominals for the rate 1/N convolutional coding when the instruction from said rate indicator corresponds to the detected 1/N convolutional coding rate, and for providing to the Viterbi decoding circuit M convolutional coding bits generated by M generator polynominals common to the 1/N convolutional coding and the rate 1/M convolutional coding and for replacing other (N−M) convolutional coding bits with nullified data when the instruction from said rate indicator corresponds to the detected 1/M convolutional coding rate.

7. The Viterbi decoder according to claim 6, wherein said data converter comprises:
    a convolutional coding bit converter for converting a convolutional coding bit from '1' to '1' and for converting a convolutional coding bit from '0' to '−1'; and
    a zero inserting circuit for converting the nullified data to '0' based on the instruction from said rate indicator.

8. The Viterbi decoder according to claim 7, wherein said zero inserting circuit inserts '0' for the nullified data if the convolutional coder does not send the nullified data.

9. The Viterbi decoder according to claim 6, wherein said rate indicator detects the convolutional coding rate for every frame having the convolutional coding bits.

10. The Viterbi decoder according to claim 6, wherein said rate indicator detects the convolutional coding rate for every burst frame having the convolutional coding bits.

11. The Viterbi decoder according to claim 6, wherein said rate indicator detects the convolutional coding rate for every call.

* * * * *